(12) United States Patent
He et al.

(10) Patent No.: US 11,714,738 B2
(45) Date of Patent: Aug. 1, 2023

(54) INTERNET-OF-THINGS EDGE SERVICES FOR DEVICE FAULT DETECTION BASED ON CURRENT SIGNALS

(71) Applicant: SAP SE, Walldorf (DE)

(72) Inventors: Jie He, Shanghai (CN); Jianwei Chen, Shanghai (CN); Xuemin Wang, Shanghai (CN)

(73) Assignee: SAP SE, Walldorf (DE)

( * ) Notice: Subject to any disclaimer, the term of this patent is extended or adjusted under 35 U.S.C. 154(b) by 198 days.

(21) Appl. No.: 17/399,170

(22) Filed: Aug. 11, 2021

(65) Prior Publication Data

US 2023/0047772 A1    Feb. 16, 2023

(51) Int. Cl.
*G06F 11/00*   (2006.01)
*G06F 11/30*   (2006.01)
*G06F 17/14*   (2006.01)
*H03M 13/15*   (2006.01)
*G06N 3/04*    (2023.01)
*G06F 11/07*   (2006.01)

(52) U.S. Cl.
CPC ...... *G06F 11/3089* (2013.01); *G06F 11/0772* (2013.01); *G06F 11/3075* (2013.01); *G06F 17/142* (2013.01); *G06N 3/04* (2013.01); *H03M 13/1575* (2013.01)

(58) Field of Classification Search
CPC ............. G06F 11/0772; G06F 11/3089; G06F 11/3075
See application file for complete search history.

(56) References Cited

U.S. PATENT DOCUMENTS

| | | | | |
|---|---|---|---|---|
| 2018/0024203 | A1* | 1/2018 | Halladay | H03K 5/26 714/15 |
| 2018/0232031 | A1* | 8/2018 | Swierk | H04L 67/12 |
| 2021/0158307 | A1* | 5/2021 | DeLuca | G06Q 10/06311 |
| 2021/0160961 | A1* | 5/2021 | DeLuca | G06F 16/903 |

OTHER PUBLICATIONS

Barbu, "Detection of and Prevention from Sybil Attacks in Internet of Things—a literature review." Master Thesis, Master's Programme in Computer Network Engineering, Apr. 2016, 50 pages.

(Continued)

*Primary Examiner* — Charles Ehne
(74) *Attorney, Agent, or Firm* — Fish & Richardson P.C.

(57) ABSTRACT

Methods, systems, and computer-readable storage media for receiving, by an anomalous operation detection service, current signal data representing a driving current applied to a device over a time period, processing, by an anomalous operation detection service, the current signal data through a deep neural network (DNN) module, a frequency spectrum analysis (FSA) module, and a time series classifier (TSC) module to provide a set of indications, each indication in the set of indications indicating one of normal operation of the device and anomalous operation of the device, processing, by an anomalous operation detection service, the set of indications through a voting gate to provide an output indication, the output indication indicating one of normal operation of the device and anomalous operation of the device, and selectively transmitting one or more of an alert and a message based on the output indication.

20 Claims, 5 Drawing Sheets

(56) References Cited

OTHER PUBLICATIONS

Bhat et al., "Edge Computing and Its Convergence With Blockchain in 5G and Beyond: Security, Challenges, and Opportunities." IEEE Access 8 205340-205373, Nov. 2020, 34 pages.

Feng et al., "Anomaly detection for electricity consumption in cloud computing: framework, methods, applications, and challenges." EURASIP Journal on Wireless Communications and Networking 2020.1, Dec. 2020, 12 pages.

Gaddam et al., "Detecting Sensor Faults, Anomalies and Outliers in the Internet of Things: A Survey on the Challenges and Solutions" MDPI Journal, Mar. 2020, 15 pages.

Lei et al., "Applications of machine learning to machine fault diagnosis: A review and roadmap" Mechanical Systems and Signal Processing 138, Jan. 2020, 39 pages.

Savic et al., "Deep Learning Anomaly Detection for Cellular IoT With Applications in Smart Logistics." IEEE Access 9, 59406-59419, Apr. 2021, 12 pages.

Singh et al., "Edge-detect: Edge-centric network intrusion detection using deep neural network." 2021 IEEE 18th Annual Consumer Communications & Networking Conference (CCNC), Jan. 2021, 6 pages.

\* cited by examiner

INTERNET-OF-THINGS EDGE SERVICES FOR DEVICE FAULT DETECTION BASED ON CURRENT SIGNALS

BACKGROUND

Mechanical devices are used in numerous applications, such as in cars, trucks, trains, planes, boats, ships, buildings, and factories, in which devices are components thereof. Example devices can include, without limitation, engines, motors, compressors, solenoids, and the like. Devices wear over time to the point at which device failure can or does occur. Failure of a device can have cascading effects. For example, failure of a device can result in failure of another device and/or failure of the application (e.g., shutdown of a production line).

In some instances, it can be difficult to identify occurrence of a failure and/or impending failure. This is particularly true in instances of, for example, gradual degradation, in which the onset of flaws, abrasion, corrosion, and the like, result in anomalous operation that may not be detectable. In some examples, anomalous operation can refer to a failure of a device or operation that is sufficiently degraded that failure of a device is imminent. Consequently, detecting anomalous operation, at an early stage, is important for quality control, unhindered operation, and the like.

Traditional techniques for detecting anomalous operation can be invasive. For example, such techniques can require a device that is suspected of having failed or is suspected of imminent failure to be uninstalled and inspected, which can be costly and unsafe. Traditional techniques can also include non-invasive detection of anomalous operation. For example, operating parameters of a device can be monitored and can be compared to baseline parameters and/or processed using one or more processing techniques (e.g., machine learning (ML)) to detect anomalous operation. Such non-invasive techniques, however, can be inaccurate, which often leads to false positives and false negatives.

SUMMARY

Implementations of the present disclosure include computer-implemented methods for detecting anomalous operation of devices. More particularly, implementations of the present disclosure are directed to an anomalous operation detection service that processes a current signal of a device through a set of analysis modules, each analysis module providing at least one indication of normal operation or at least one indication of anomalous operation, such that a set of indications is provided. The set of indications is evaluated to determine whether anomalous operation of the device is occurring.

In some implementations, actions include receiving, by an anomalous operation detection service, current signal data representing a driving current applied to a device over a time period, processing, by an anomalous operation detection service, the current signal data through a deep neural network (DNN) module, a frequency spectrum analysis (FSA) module, and a time series classifier (TSC) module to provide a set of indications, each indication in the set of indications indicating one of normal operation of the device and anomalous operation of the device, processing, by an anomalous operation detection service, the set of indications through a voting gate to provide an output indication, the output indication indicating one of normal operation of the device and anomalous operation of the device, and selectively transmitting one or more of an alert and a message based on the output indication. Other implementations of this aspect include corresponding systems, apparatus, and computer programs, configured to perform the actions of the methods, encoded on computer storage devices.

These and other implementations can each optionally include one or more of the following features: a processing the current signal data through a DNN module includes receiving, by the DNN module, the current signal data, normalizing, by the DNN module, the current signal data to provide normalized data, inputting, by the DNN module, the normalized data to a DNN, the DNN providing a prediction, and providing an indication of the set of indications based on the prediction; the DNN is specific to the device; processing the current signal data through a FSA module includes receiving, by the FSA module, the current signal data, processing, by the FSA module, through each of a Hanning window sub-module, a Hamming window sub-module, and a Blackman sub-module, each processing the current signal data through a respective window function to provide an adjusted input, and processing the adjusted input through a fast Fourier transform (FFT) to provide a converted input, and outputting, by the FSA module, a sub-set of indications based on converted outputs of the Hanning window sub-module, the Hamming window sub-module, and the Blackman sub-module; the sub-set of indications includes an indication based on converted outputs of the Hanning window sub-module and the Hamming window sub-module, and an indication based on the converted output of the Blackman window sub-module; processing the current signal data through a TSC module includes receiving, by the TSC module, the current signal data, processing, by the TSC module, the current signal data using dynamic time warping (DTW) to provide a comparison between the current signal to a groundtruth current signal, and providing an indication of the set of indications based on the comparison; and the device is an Internet-of-Things (IoT) device and the anomalous operation detection service is executed as an edge service remote from a cloud platform.

The present disclosure also provides a computer-readable storage medium coupled to one or more processors and having instructions stored thereon which, when executed by the one or more processors, cause the one or more processors to perform operations in accordance with implementations of the methods provided herein.

The present disclosure further provides a system for implementing the methods provided herein. The system includes one or more processors, and a computer-readable storage medium coupled to the one or more processors having instructions stored thereon which, when executed by the one or more processors, cause the one or more processors to perform operations in accordance with implementations of the methods provided herein.

It is appreciated that methods in accordance with the present disclosure can include any combination of the aspects and features described herein. That is, methods in accordance with the present disclosure are not limited to the combinations of aspects and features specifically described herein, but also include any combination of the aspects and features provided.

The details of one or more implementations of the present disclosure are set forth in the accompanying drawings and the description below. Other features and advantages of the present disclosure will be apparent from the description and drawings, and from the claims.

DESCRIPTION OF DRAWINGS

Like reference symbols in the various drawings indicate like elements.

DETAILED DESCRIPTION

Implementations of the present disclosure are generally directed to detecting anomalous operation of devices. More particularly, implementations of the present disclosure are directed to an anomalous operation detection service that processes a current signal of a device through a set of analysis modules, each analysis module providing at least one indication of normal operation or at least one indication of anomalous operation, such that a set of indications is provided. The set of indications is evaluated to determine whether anomalous operation of the device is occurring. As described in further detail herein, the set of analysis modules can include a deep neural network (DNN) module, a frequency spectrum analysis (FSA) module and a time series classification (TSC) module. As also described in further detail herein, the anomalous operation detection service is provided as an edge service in an Internet-of-Things (IoT) context.

In some implementations, actions include receiving, by an anomalous operation detection service, current signal data representing a driving current applied to a device over a time period, processing, by an anomalous operation detection service, the current signal data through a DNN module, a FSA module, and a TSC module to provide a set of indications, each indication in the set of indications indicating one of normal operation of the device and anomalous operation of the device, processing, by an anomalous operation detection service, the set of indications through a voting gate to provide an output indication, the output indication indicating one of normal operation of the device and anomalous operation of the device, and selectively transmitting one or more of an alert and a message based on the output indication.

To provide context for implementations of the present disclosure, and as introduced above, mechanical devices, also referred to as devices herein, are used in multiple applications. Example applications can include cars, trucks, trains, planes, boats, ships, buildings, and factories, in which devices are components thereof. Example devices can include, without limitation, engines, motors, compressors, solenoids, and the like. Devices wear over time to the point at which device failure can or does occur. Failure of a device can have cascading effects. For example, failure of a device can result in failure of another device and/or failure of the application (e.g., shutdown of a production line).

In some instances, it can be difficult to identify occurrence of a failure and/or impending failure. This is particularly true in instances of, for example, gradual degradation, in which the onset of flaws, abrasion, corrosion, and the like, result in anomalous operation that may not be detectable. In some examples, anomalous operation can refer to a failure of a device or operation that is sufficiently degraded that failure of a device is imminent. Consequently, detecting anomalous operation, at an early stage, is important for quality control, unhindered operation, and the like.

Traditional techniques for detecting anomalous operation can be invasive. For example, such techniques can require a device that is suspected of having failed or is suspected of imminent failure to be uninstalled and inspected, which can be costly and unsafe. For example, an entire production line in which the suspected device is installed, would be shut down to remove the device from service, inspect the device, and repair or replace the device. These activities lower productivity and can result in damage to other devices and/or accidents. Further, reinstallation of the device (e.g., repaired device, replacement device) can introduce error, which can create additional problems. For example, devices can be in locations that are difficult to access complicating uninstallation and installation. Further, and in terms of preventive maintenance to avoid failure, traditional techniques have difficulty in determining when a maintenance activity should be adopted.

Traditional techniques can also include non-invasive detection of anomalous operation. For example, operating parameters of a device can be monitored and can be compared to baseline parameters and/or processed using one or more processing techniques (e.g., machine learning (ML)) to detect anomalous operation. In the case of electrical devices, for example, a current signal of a device can be monitored to detect anomalous operation. Such non-invasive techniques, however, can be inaccurate, which often leads to false positives and false negatives. A false positive indicates anomalous operation when, in fact, the device is operating normally. A false negative indicates normal operation when, in fact, anomalous operation is present. Such inaccurate detection can incur similar problems as discussed above with respect to invasive detection. For example, a false negative can result in a device failing and cascading effects, which could have been avoided. As another example, a false positive can result in difficulties in unneeded accessing and/or removing and introduction of error for a device that is operating normally.

In view of the above context, implementations of the present disclosure are directed to an anomalous operation detection service that processes a current signal of a device through a set of analysis modules, each analysis module providing at least one indication of normal operation or of anomalous operation, such that a set of indications is provided. The set of indications is evaluated to determine whether anomalous operation of the device is occurring. In some examples, the set of analysis modules can include a DNN module, a FSA module, and a TSC module. In some examples, the anomalous operation detection service is provided as an edge service in an IoT context.

In some implementations, the anomalous operation detection service performs online detection based on the current signal of a device. The current signal (e.g., provided by a current sensor) represents the driving current of the device and is sensitive to operation of the device. For example, if there is a flaw or malfunction of the device that induces some anomalous operation (e.g., severs, grinds, twists, or abrades something), the driving current of the device would be adjusted or adapted. For example, a feedback system is provided to automated control hardware, which adjusts the driving current in response to abnormal torque or counteracting force acting on or induced within the device. Consequently, the current signal renders different features from normal status, for example, different wave shapes or frequency spectrum.

As described in further detail herein, the anomalous operation detection service employs techniques of data science and edge computation to discriminate abnormal driving current from normal driving current. In some implementations, the current signal (provided as streaming data) is processed as a time series, with multiple classification techniques of ML for pattern recognition (e.g., abnormal pattern, normal pattern). The anomalous operation detection service uses a DNN, a FSA, and a TSC for pattern recognition to detect instances of anomalous operation. The respective outputs of the DNN, the FSA, and the TSC are consolidated through a logical relationship to provide an output that indicates whether anomalous operation is present for a device in question. In this manner, the anomalous operation detection service achieves a high precision of failure detection with low false negative and false positive rates, as compared to traditional techniques. In some examples, the result of the anomalous operation detection (i.e., the output) is displayed on one or more UIs. In some examples, if the device is found faulted (i.e., anomalous operation is detected), an alarm and/or a warning message are provided.

Figure 1:
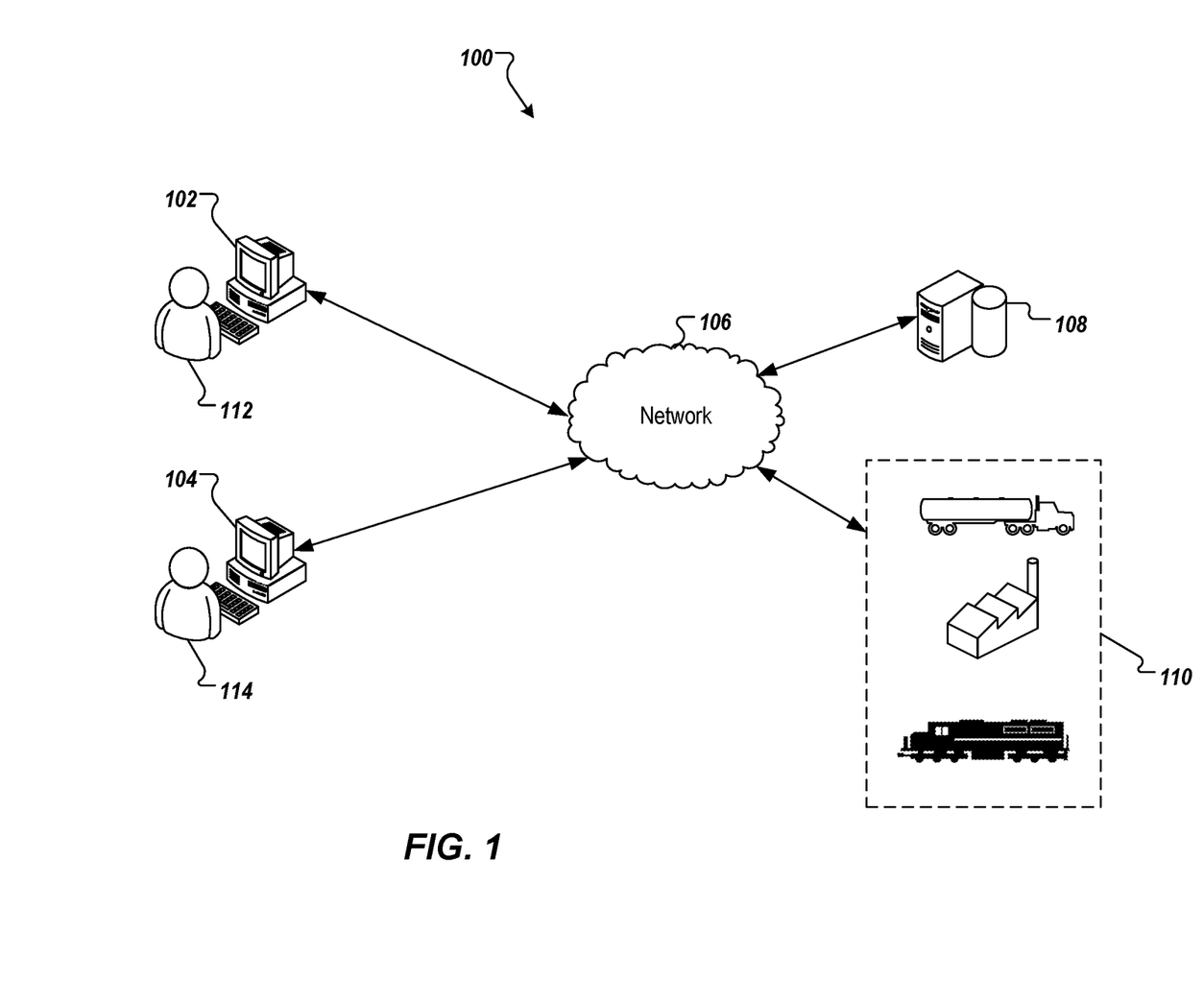
FIG. 1 depicts an example high-level architecture in accordance with implementations of the present disclosure.

FIG. 1 depicts an example architecture 100 in accordance with implementations of the present disclosure. In the depicted example, the example architecture 100 includes one or more client devices 102, 104, a network 106, a server system 108, and devices 110. The server system 108 includes one or more server devices and databases (e.g., processors, memory). In the depicted example, respective users 112, 114 interact with the client devices 102, 104. In an example context, the users 112, 114 can include users (e.g., enterprise operators, maintenance agents), who interact with one or more a data analytics system hosted by the server system 108.

In some examples, the client devices 102, 104 can communicate with the server system 108 over the network 106. In some examples, the client devices 102, 104 can include any appropriate type of computing device such as a desktop computer, a laptop computer, a handheld computer, a tablet computer, a personal digital assistant (PDA), a cellular telephone, a network appliance, a camera, a smart phone, an enhanced general packet radio service (EGPRS) mobile phone, a media player, a navigation device, an email device, a game console, or an appropriate combination of any two or more of these devices or other data processing devices. In some implementations, the network 106 can include a large computer network, such as a local area network (LAN), a wide area network (WAN), the Internet, a cellular network, a telephone network (e.g., PSTN) or an appropriate combination thereof connecting any number of communication devices, mobile computing devices, fixed computing devices and server systems.

In some implementations, the server system 108 includes at least one server and at least one data store. In the example of FIG. 1, the server system 108 is intended to represent various forms of servers including, but not limited to a web server, an application server, a proxy server, a network server, and/or a server pool. In general, server systems accept requests for application services and provides such services to any number of client devices (e.g., the client devices 102, 104 over the network 106).

In some implementations, one or more data stores of the server system 108 store one or more databases. In some examples, a database can be provided as an in-memory database. In some examples, an in-memory database is a database management system that uses main memory for data storage. In some examples, main memory includes random access memory (RAM) that communicates with one or more processors (e.g., central processing units (CPUs)), over a memory bus. An-memory database can be contrasted with database management systems that employ a disk storage mechanism. In some examples, in-memory databases are faster than disk storage databases, because internal optimization algorithms can be simpler and execute fewer CPU instructions (e.g., require reduced CPU consumption). In some examples, accessing data in an in-memory database eliminates seek time when querying the data, which provides faster and more predictable performance than disk-storage databases. An example in-memory database system includes SAP HANA provided by SAP SE of Walldorf, Germany.

In some examples, the devices 110 can include devices, for which anomalous operation is to be detected and/or prevented (e.g., predictive maintenance is to be conducted). Example devices can include, without limitation, engines, motors, compressors, solenoids, and the like. In some examples, one or more of the devices 110 are components of a larger application including, for example and without limitation, a car, a truck, a train, a plane, a boat, a ship, a building, a factory, and the like. In some examples, the devices 110 include IoT devices, which can be described as nonstandard computing devices are able to transmit data over the network 106. In some examples, the devices 110 are wirelessly connected to the network 106. For example, and without limitation, a device can include an electric motor having one or more sensors that are responsive to operation of the electric motor to generate signals representative of respective operating parameters of the electric motor. An example sensor can include a current sensor that is responsive to current applied to the electric motor and that generates a current signal. In some examples, the electric motor, as an IoT device, can transmit the current signal over the network 106.

In accordance with implementations of the present disclosure, an anomalous operation detection service is provided to monitor operation of the devices 110 and detect occurrence(s) of anomalous operation thereof. In some examples, the anomalous operation detection service is provided as part of a larger platform for monitoring and managing operations of an enterprise. For example, the platform can be hosted in one or more of the server systems 108. In this context, the anomalous operation detection service serves the platform in decision-making processes with respect to operations of the enterprise. An example platform includes the SAP Business Technology Platform (BTP), which is a cloud-based platform (e.g., Cloud Foundry) that can be described as providing in-memory processing, sustainable, agile solutions and services to integrate data and extend applications, and fully embedded analytics and intelligent technologies to support enterprise operations. Another example platform includes the SAP Leonardo IoT Predictive Maintenance Service (PDMS). Although example platforms are discussed herein, it is contemplated that the anomalous operation detection service can be used with any appropriate platform.

Figure 2:
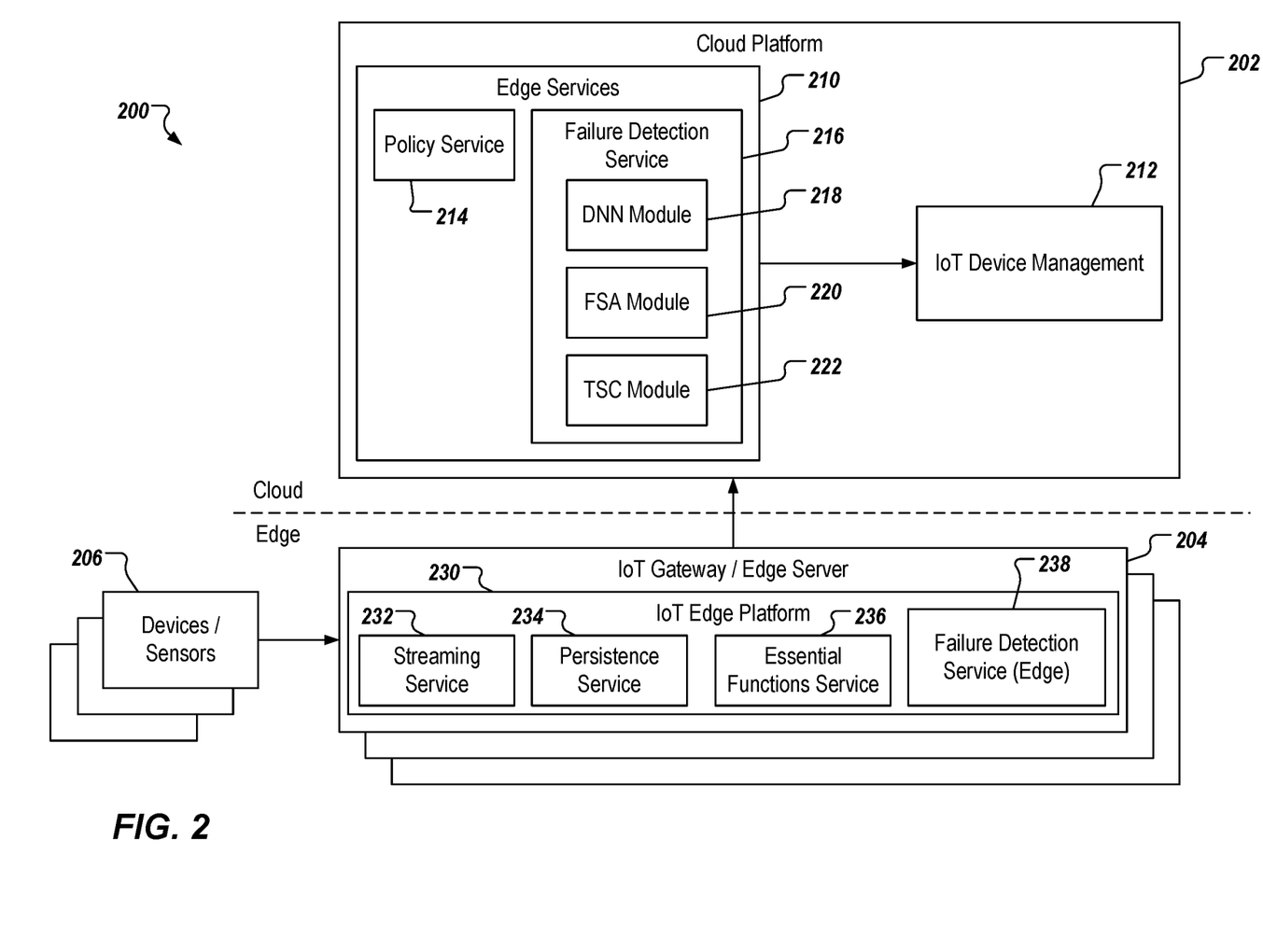
FIG. 2 depicts an example conceptual architecture in accordance with implementations of the present disclosure.

FIG. 2 depicts an example conceptual architecture 200 in accordance with implementations of the present disclosure. The example conceptual architecture 200 depicts a non-limiting, example deployment of the anomalous operation detection service of the present disclosure.

The example conceptual architecture 200 includes a cloud platform 202, edge components 204, and devices 206. In some examples, the devices 206 include one or more sensors that are responsive to and generate signals based on operating parameters of the respective device. In the context of the present disclosure, a current sensor can be provided in each of the devices 206, which is responsive to a driving current to the respective device and generates a current signal (e.g., as time series data) based thereon. In some examples, each device 206 and/or sensor is provided as an IoT device that is able to transmit data over a network (e.g., the network 106) to at least one of the edge components 204. An example cloud platform 202 can include, without limitation, SAP BTP, introduced above. In the example of FIG. 2, the cloud platform 202 includes an edge services system 210 and an IoT device management system 212. An example edge services system 210 can include, without limitation, SAP Edge Services. An example IoT device management system 212 can include, without limitation, SAP IoT Device Management.

The example of FIG. 2 represents an example deployment of the anomalous operation detection service of the present disclosure as an edge service. More particularly, the anomalous operation detection of the present disclosure can be embedded in a failure detection module 238 as a custom edge service that is centrally managed by the edge services system 210 within the cloud platform 202. In general, the edge services system 210 enables services to be deployed at the edge and orchestrated from the cloud to extend the processing power of the cloud to the edge. That is, services can be deployed to the edge to perform local compute, persistency, and execution of processes.

In the example deployment of FIG. 2, a broad range of IoT services and protocols can be used to manage device and/or system lifecycles. For example, connecting IoT devices, such as the devices 206, to the edge services system 210 provides scalable ingestion of sensor data as well as IoT device management and connectivity through the IoT device management system 212. In some examples, the IoT device management system 212 provides the definition of message format for measures and commands, configuration of the protocol to be used for data transmission and setting up credentials for accessing the IoT services. In some examples, the IoT device management system 212 provides functionality for management of tenants and users.

In some examples, data received from the devices 206 is processed and aggregated to assess the status of the devices 206. Using the edge services system 210 with the failure detection module 238 deployed to the edge components 204, decisions can be made in real-time by processing and analyzing data at the intelligent edge without latency and with reduced data transmission and communication costs through data throttling and optimization of the upstream channel. In this manner, anomalous operation detection can be executed locally (at the edge) even in instances of intermittent connectivity or even offline.

In the example of FIG. 2, the edge services system 210 includes a policy service module 214 and a failure detection service module 216. The failure detection service module 216 includes a DNN module 218, a FSA module 220, and a TSC module 222. In some examples, the policy service module 214 executes a policy service that provides orchestration and lifecycle management of edge services from the cloud platform 202, and manages edge nodes at scale centrally in the cloud, deploy edge services, and configurations from the cloud to the edge. In some examples, the failure detection module 214 is a custom edge service that is generated in the cloud platform 202 (e.g., training of DNNs) and is deployed to the edge components 204 as the failure detection module 238 using the policy service. Accordingly, the failure detection module 238 executes the anomalous operation detection service of the present disclosure on the edge.

The edge component 204 includes an IoT edge platform module 230, which includes a streaming service module 232, a persistence service module 234, an essential functions service (EFS) module 236, and the failure detection module 238. In the example deployment, the devices 206 (IoT devices) are registered in the cloud platform 202 with the device management system 212 and are synchronized to the edge components 204. In this manner, the lifecycle of the devices 206 (e.g., software updates) can be managed and enables the devices 206 to connect to edge and the cloud to send or receive data. In some examples, the streaming service module 232 executes a streaming service that uses complex event processing to analyze IoT sensor data in near real-time. Administrators can rely on a known sensor profile or manually configure the streaming service to monitor the flow of data from an IoT sensor for a variety of actionable patterns (e.g., thresholds, timing patterns, conditional logic). In some examples, the persistence service module 234 executes a persistence service that provides the ability to store sensor data at the edge and enables other edge-based applications access to a generic secure persistence service. In some examples, the EFS module 236 executes a EFS that extends a subset of system functionality to the edge and provides context data and transactions at the edge.

Figure 3:
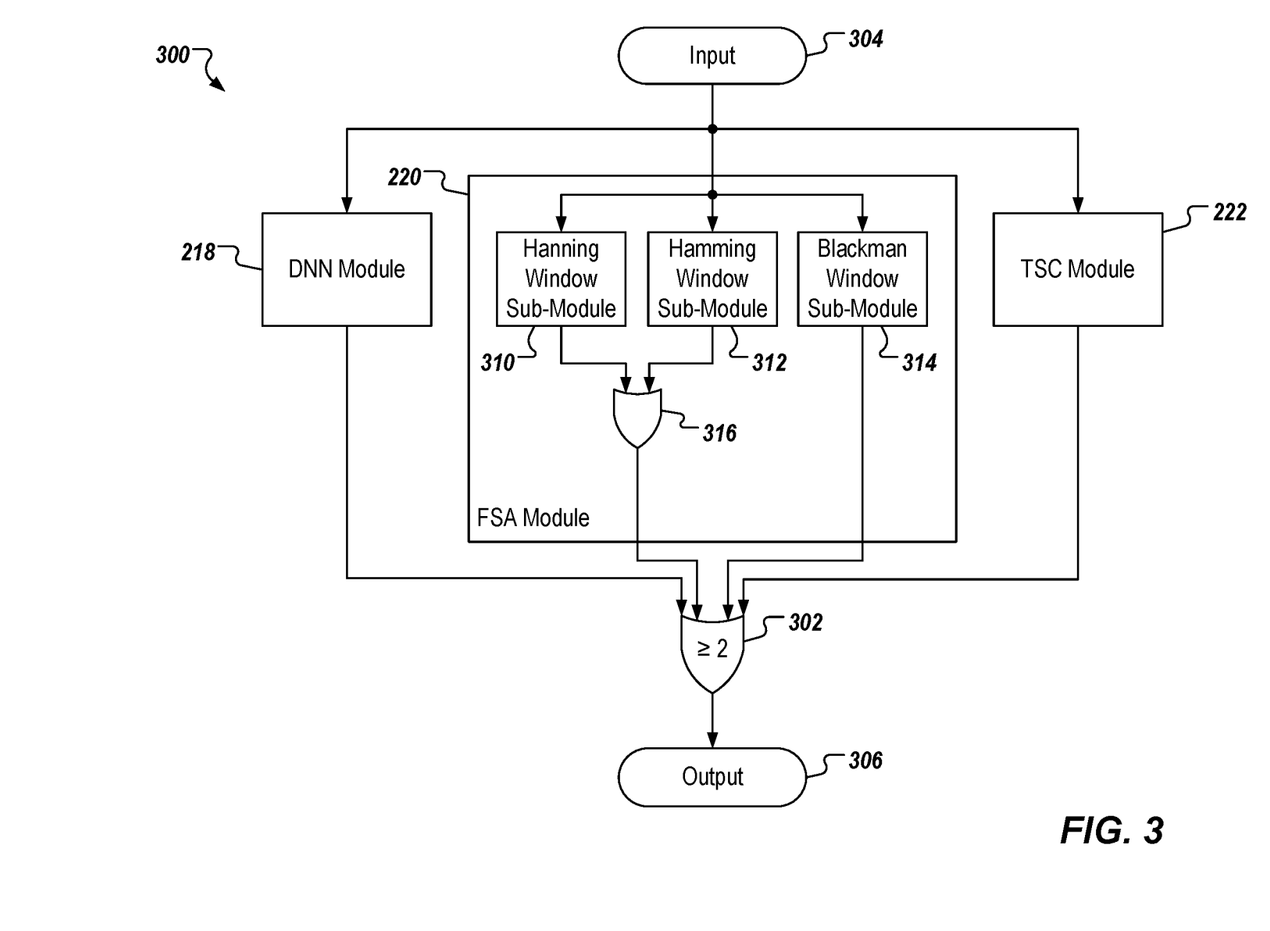
FIG. 3 depicts an example signal flow diagram for anomaly detection in accordance with implementations of the present disclosure.

FIG. 3 depicts an example signal flow diagram 300 for anomaly detection in accordance with implementations of the present disclosure. The example signal flow diagram 300 includes the DNN module 218, the FSA module 220, the TSC module 222, and a voting gate 302. As described in further detail herein, each of the DNN module 218, the FSA module 220, and the TSC module 222 processes an input 304 to provide indications. In some examples, the input 304 includes time series data representative of a driving current (e.g., a current signal) applied to a respective device. In some examples, the input 304 includes metadata representative of the particular device (e.g., a device identifier that uniquely identifies the device, a make/model of the device). In some examples, the DNN module 218 provides a first indication, the FSA module 220 provides a second indication and a third indication, and the TSC module 222 provides a fourth indication, each based on the input 304. Accordingly, the first indication, the second indication, the third indication, and the fourth indication can be collectively a set of indications that is to be evaluated (e.g., through the voting gate 302).

In some examples, each indication can be one of multiple values to indicate either anomalous operation or normal operation. For example, the indication can be either TRUE or FALSE. In some examples, TRUE can indicate anomalous operation and FALSE can indicate normal operation. In some examples, TRUE can indicate normal operation and FALSE can indicate anomalous operation. As another example, the indication can be either 1 or 0. In some examples, 1 can indicate anomalous operation and 0 can indicate normal operation. In some examples, 1 can indicate normal operation and 0 can indicate anomalous operation.

The set of indications is input to the voting gate 302, which consolidates the indications to provide an output 306. The output 306 is representative of either anomalous operation or normal operation of a device in question (i.e., the device, from which the input 304 originated). In some examples, the output 306 can be either TRUE or FALSE. In some examples, TRUE can indicate anomalous operation and FALSE can indicate normal operation. In some examples, TRUE can indicate normal operation and FALSE can indicate anomalous operation. As another example, the output 306 can be either 1 or 0. In some examples, 1 can indicate anomalous operation and 0 can indicate normal operation. In some examples, 1 can indicate normal operation and 0 can indicate anomalous operation.

Accordingly, the input 304, including current signal data, is separately processed by each of the DNN module 218, the FSA module 220, and the TSC module 222 in parallel, and the output 306 is provided from the voting gate 302 based on indications of the DNN module 218, the FSA module 220, and the TSC module 222.

In further detail, the DNN module 218 employs a DNN that is trained to detect one or both of normal operation and anomalous operation of the device. In some examples, the DNN is trained for the particular device (e.g., type, make, model). For example, training data can be provided for the device. In some examples, the training data is normalized with respect to one or more statistical measures. Example statistical measures can include mean and standard deviation. In some examples, the training data is normalized using the following example relationship:

$$d_n = \frac{(d_r - \bar{d})}{\sigma}$$

where $d_n$ is a normalized data value, $d_r$ is a raw data value, $\bar{d}$ is the mean data value, and $\sigma$ is the standard deviation.

In some examples, the DNN is iteratively trained, where, during an iteration, one or more parameters of the DNN are adjusted, and an output is generated based on the training data. For each iteration, a loss value is determined based on a loss function. The loss value represents a degree of accuracy of the output of the DNN. The loss value can be described as a representation of a degree of difference between the output of the DNN and an expected output of the DNN (the expected output being provided from the training data). In some examples, if the loss value does not meet an expected value (e.g., is not equal to zero), parameters of the DNN are adjusted in another iteration of training. In some instances, this process is repeated until the loss value meets the expected value.

During inference (e.g., post-training, production use of the DNN), the input 304 is received by the DNN module 218. In some examples, the DNN module 218 selects a DNN from a set of DNNs based on the device metadata of the input 304. In this manner, the DNN that is selected is specific to the device and/or the make/model of the device, from which the input 304 originated. In some examples, the input 304 is normalized based on the one or more statistical measures to provide normalized input. In some examples, the one or more statistical measures are the same statistical measure(s) that were determined during training and used to normalize the training data before training the DNN. By using the same statistical measures as provided from the training data (and not inputs 304 received by the DNN module 218 during inference), a scale of the normalization is consistent, such that an indication of the DNN is not biased as a result of normalization. The DNN processes the normalized input to provide an indication as a prediction. For example, the DNN receives the normalized input, processes the normalized input to output a prediction, the prediction being an indication as to whether the device is experiencing normal operation or anomalous operation. In some examples, if the prediction indicates normal operation, the DNN module 218 provides the first indication having a first value (e.g., TRUE, 1; FALSE, 0). In some examples, if the prediction indicates anomalous operation, the DNN module 218 provides the first indication having a second value (e.g., FALSE, 0; TRUE, 1).

In some implementations, the FSA module 220 includes a Hanning window sub-module 310, a Hamming window sub-module 312, a Blackman window sub-module 314, and an OR gate 316. Each of the Hanning window sub-module 310, the Hamming window sub-module 312, and the Blackman window sub-module 314 receives the input 304 and processes the input in parallel to provide a respective indication as to either normal operation or anomalous operation. In some examples, the Hanning window sub-module 310, the Hamming window sub-module 312, and the Blackman window sub-module 314, each applies a respective window function to the input 304 to provide an adjusted input, and executes a fast Fourier transform (FFT) on the adjusted input to convert the adjusted input from a time domain to a frequency domain. More particularly, the FFT deconstructs the adjusted input, as a time domain representation of the current signal, into a converted input, as a frequency domain representation of the current signal. The frequency domain shows the current values present at different frequencies. As such, the converted input can be provided as a frequency-amplitude graph (e.g., frequency on the x-axis, amplitude (current value) on the y-axis).

With respect to the window functions, in applying FFT to measure the frequency component of a signal, such as the current signal of a device, the FFT assumes that the signal is a finite data set. This assumed finite data set can be described as a continuous spectrum that is one period of a periodic signal. That is, the signal is assumed to have a circular topology (periodic), such that the endpoints of the signal (time waveform) are interpreted as though connected and thus, continuous. However, in instances, such as a current signal, the number of periods in the signal is not an integer, such that the endpoints are discontinuous. This would result in the FFT providing a transformed signal (e.g., converted input in the frequency domain) having high-frequency components that are not present in the original signal.

To minimize the appearance of high-frequency components through the FFT, the signal (here, the current signal of the input 304) is processed through a windowing function (here, multiple windowing functions in parallel). In general, a windowing function reduces the amplitude of the discontinuities at the boundaries of the signal and is performed by multiplying the time record by a finite-length window with an amplitude that varies smoothly and gradually to zero or toward zero at the edges. In this manner, the endpoints of the signal are adjusted to provide a continuous or almost continuous waveform that is absent sharp transitions (e.g., as the adjusted input).

Referring again to FIG. 3, the Hanning window sub-module 310 applies a Hanning window to the input 304 to provide an adjusted input. In general, the Hanning window (also referred to as Hann window) has a sinusoidal shape that results in a wide peak and low side lobes that touch zero at both ends. In this manner, the Hanning window eliminates discontinuity of the input 304, such that the adjusted input is continuous. The adjusted input is processed through a FFT to provide a converted input, which is in the frequency domain.

In some examples, the converted input is processed through a classifier (i.e., a ML model) that classifies the converted input, and thus the input 304, as representing normal operation (e.g., normal class) or anomalous operation (e.g., anomalous class). In some examples, if the input 304 is determined to represent normal operation (e.g., normal class is output from classifier), the Hanning window sub-module 310 provides an indication having a first value (e.g., TRUE, 1; FALSE, 0). In some examples, if the input 304 is determined to represent anomalous operation (e.g., anomalous class is output from classifier), the Hanning window sub-module 310 provides an indication having a second value (e.g., FALSE, 0; TRUE, 1).

The Hamming window sub-module 312 applies a Hamming window to the input 304 to provide an adjusted input. In general, the Hamming window has a sinusoidal shape that results in a wide peak and low side lobes that do not touch zero at either end. In this manner, the Hamming window mitigates discontinuity of the input 304, such that the adjusted input is approximately continuous. The adjusted input is processed through a FFT to provide a converted input, which is in the frequency domain.

In some examples, the converted input is processed through a classifier (i.e., a ML model) that classifies the converted input, and thus the input 304, as representing normal operation (e.g., normal class) or anomalous operation (e.g., anomalous class). In some examples, if the input 304 is determined to represent normal operation (e.g., normal class is output from classifier), the Hamming window sub-module 312 provides an indication having a first value (e.g., TRUE, 1; FALSE, 0). In some examples, if the input 304 is determined to represent anomalous operation (e.g., anomalous class is output from classifier), the Hamming window sub-module 312 provides an indication having a second value (e.g., FALSE, 0; TRUE, 1).

As depicted in FIG. 3, the indication of the Hanning window sub-module 310 and the indication of the Hamming window sub-module 312 are input to the OR gate 316. In some examples, the OR gate 316 provides the second indication output by the FSA module 220. In some examples, the OR gate 316 passes any indication output by the Hanning window sub-module 310 or the Hamming window sub-module 312 that indicates anomalous operation. That is, if either indication represents anomalous operation, the second indication represents anomalous operation, and, if both indications represent normal operation, the second indication represents normal operation.

The Blackman window sub-module 314 applies a Blackman window (also referred to as a Blackman-Harris window) to the input 304 to provide an adjusted input. In general, the Blackman window has a bell shape that to near zero at either end. In this manner, the Blackman window mitigates discontinuity of the input 304, such that the adjusted input is approximately continuous. The adjusted input is processed through a FFT to provide a converted input, which is in the frequency domain.

In some examples, the converted input is processed through a classifier (i.e., a ML model) that classifies the converted input, and thus the input 304, as representing normal operation (e.g., normal class) or anomalous operation (e.g., anomalous class). In some examples, if the input 304 is determined to represent normal operation (e.g., normal class is output from classifier), the Blackman window sub-module 314 provides an indication having a first value (e.g., TRUE, 1; FALSE, 0). In some examples, if the input 304 is determined to represent anomalous operation (e.g., anomalous class is output from classifier), the Blackman window sub-module 314 provides an indication having a second value (e.g., FALSE, 0; TRUE, 1).

The TSC module 222 executes TSC on the input 304 to provide the fourth indication. In some examples, the TSC module 222 executes dynamic time warping (DTW) to compare the input 304 to a known normal current signal, also referred to as groudtruth current signal. In some examples, the groundtruth current signal is provided based on one or more current signals obtained from a device or multiple devices that are known to be operating normally. In some examples, DTW is used to determine distance values between the input 304 (current signal) and the groundtruth current signal as a measure of similarity. In some examples, if the distance does not exceed a threshold distance, the input 304 and the groundtruth current signal are determined to be sufficiently similar that normal operation is detected. In this case, the TSC module 222 outputs the fourth indication with a first value (e.g., TRUE, 1; FALSE, 0). In some examples, if the distance exceeds the threshold distance, the input 304 and the groundtruth current signal are determined to be sufficiently dissimilar that anomalous operation is detected. In this case, the TSC module 222 outputs the fourth indication with a second value (e.g., FALSE, 0; TRUE, 1).

As introduced above, the first indication from the DNN module 218, the second indication and the third indication from the FSA module 220, and the fourth indication from the TSC module 222 are input to the voting gate 302. In some examples, the voting gate 302 includes passing logic that is two out of four. In this example, the voting gate requires at least two of the four indications to indicate anomalous operation to also indicate anomalous operation within the output 306. For example, if two of the first indication, the second indication, the third indication, and the fourth indication indicate anomalous operation, the output 306 is assigned a value (e.g., TRUE, 1; FALSE, 0) that also indicates anomalous operation. If less than two of the first indication, the second indication, the third indication, and the fourth indication indicate anomalous operation, the output 306 is assigned a value (e.g., FALSE, 0; TRUE, 1) that indicates normal operation. In this manner, the voting gate 302, processing multiple indicators from respective channels, rules out any single spurious or oversensitive actuation of the multiple channels. This effectively ensures the sensitivity of anomaly detection, while inhibiting spurious triggers. In other words, reducing instances of false positives or false negatives.

Figure 4:
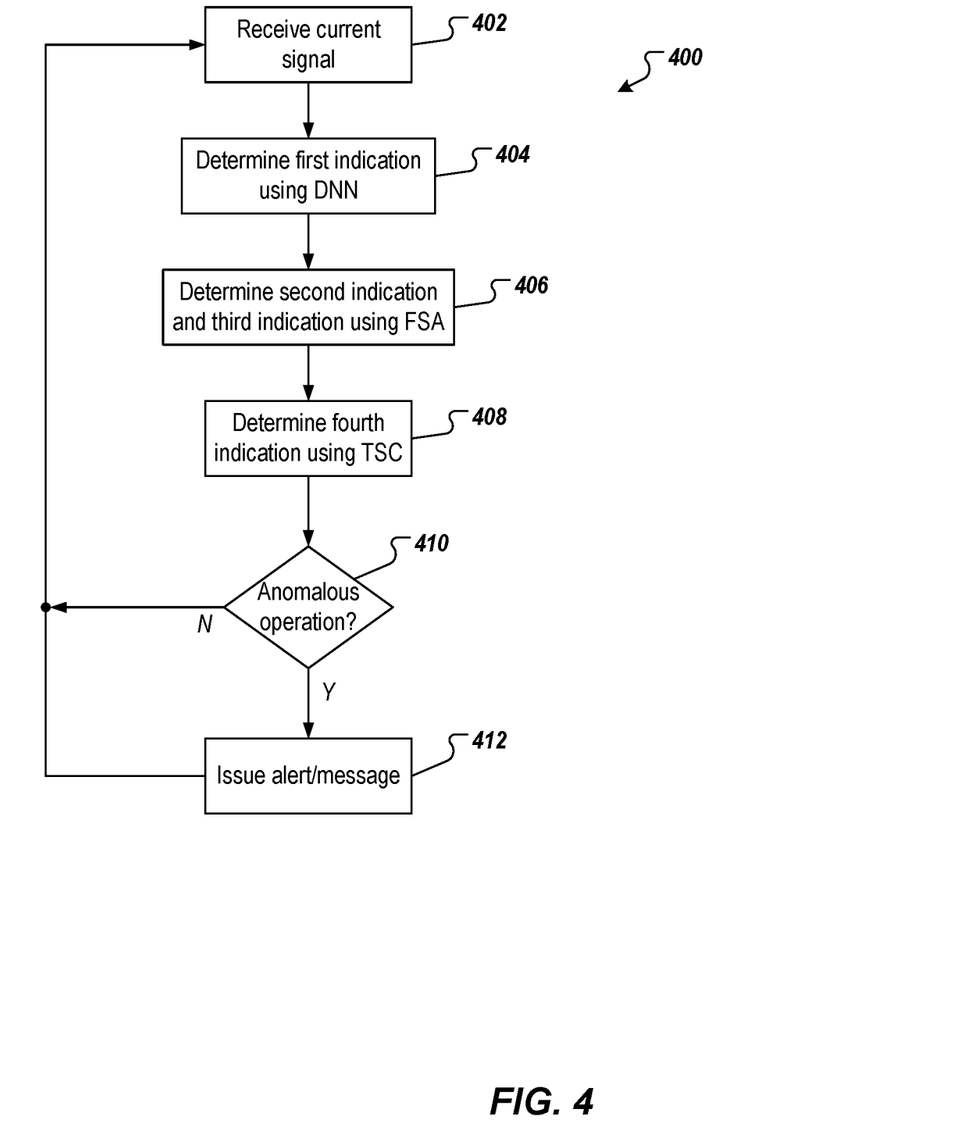
FIG. 4 depicts an example process that can be executed in accordance with implementations of the present disclosure.

FIG. 4 depicts an example process 400 that can be executed in accordance with implementations of the present disclosure. In some examples, the example process 400 can be provided by one or more computer-executable programs executed using one or more computing devices.

A current signal is received (402). For example, and as described herein, an IoT device 206 transmits a current signal to an edge component 204 of FIG. 2. In some examples, the current signal is provided as time series data representative of driving current of the IoT device 206. A first indication is determined using DNN (404). For example, and as described herein, the input 304 is received by the DNN module 218, which normalizes the input 304 based on the one or more statistical measures (determined from training data used to train the DNN) to provide normalized input. The DNN processes the normalized input to provide the first indication as a prediction. For example, the DNN receives the normalized input, process the normalized input to output a prediction, the prediction being an indication as to whether the device is experiencing normal operation or anomalous operation. In some examples, if the prediction indicates normal operation, the DNN module 218 provides the first indication having a first value (e.g., TRUE, 1; FALSE, 0). In some examples, if the prediction indicates anomalous operation, the DNN module 218 provides the first indication having a second value (e.g., FALSE, 0; TRUE, 1).

A second indication and a third indication are determined using FSA (406). For example, and as described herein, the input 304 is received by the FSA module 220, which processes the input 304, in parallel, through the Hanning window sub-module 310, the Hamming window sub-module 312, and the Blackman window sub-module 314. The Hanning window sub-module 310 and the Hamming window sub-module 312 process the input 304 to provide respective indications that are input to the OR gate 316, which provides the second indication. The Blackman window sub-module 314 processes the input 304 to provide the third indication. A fourth indication is determined using TSC (408). For example, and as described herein, the TSC module 222 executes DTW to compare the input 304 to a groudtruth current signal.

In some examples, determining the first indication using the DNN (404), determining the second indication and the third indication using FSA (406), and determining the fourth indication using TSC (408) are performed in parallel (e.g., at least partially contemporaneous with each other).

It is determined whether anomalous operation is present (410). For example, and as described herein, the first indication from the DNN module 218, the second indication and the third indication from the FSA module 220, and the fourth indication from the TSC module 222 are input to the voting gate 302. In some examples, if two of the first indication, the second indication, the third indication, and the fourth indication indicate anomalous operation, the output 306 is assigned a value (e.g., TRUE, 1; FALSE, 0) that also indicates anomalous operation. If less than two of the first indication, the second indication, the third indication, and the fourth indication indicate anomalous operation, the output 306 is assigned a value (e.g., FALSE, 0; TRUE, 1) that indicates normal operation. If anomalous operation is not present, the example process 400 loops back. If anomalous operation is present, an alarm and/or message are issued (412), and the example process 400 loops back.

Figure 5:
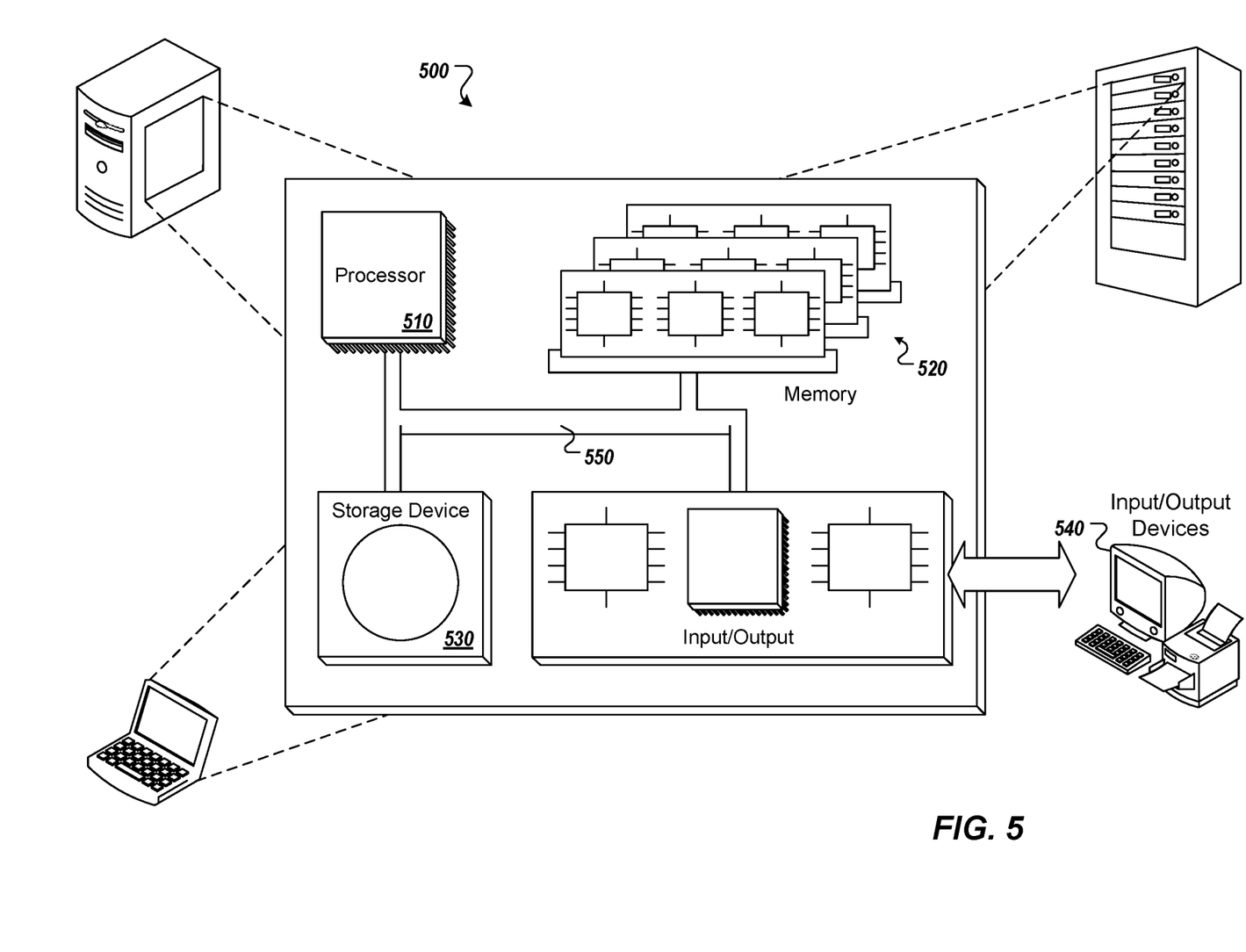
FIG. 5 is a schematic illustration of example computer systems that can be used to execute implementations of the present disclosure.

Referring now to FIG. 5, a schematic diagram of an example computing system 500 is provided. The system 500 can be used for the operations described in association with the implementations described herein. For example, the system 500 may be included in any or all of the server components discussed herein. The system 500 includes a processor 510, a memory 520, a storage device 530, and an input/output device 540. The components 510, 520, 530, 540 are interconnected using a system bus 550. The processor 510 is capable of processing instructions for execution within the system 500. In one implementation, the processor 510 is a single-threaded processor. In another implementation, the processor 510 is a multi-threaded processor. The processor 510 is capable of processing instructions stored in the memory 520 or on the storage device 530 to display graphical information for a user interface on the input/output device 540.

The memory 520 stores information within the system 500. In one implementation, the memory 520 is a computer-readable medium. In one implementation, the memory 520 is a volatile memory unit. In another implementation, the memory 520 is a non-volatile memory unit. The storage device 530 is capable of providing mass storage for the system 500. In one implementation, the storage device 530 is a computer-readable medium. In various different implementations, the storage device 530 may be a floppy disk device, a hard disk device, an optical disk device, or a tape device. The input/output device 540 provides input/output operations for the system 500. In one implementation, the input/output device 540 includes a keyboard and/or pointing device. In another implementation, the input/output device 540 includes a display unit for displaying graphical user interfaces.

The features described can be implemented in digital electronic circuitry, or in computer hardware, firmware, software, or in combinations of them. The apparatus can be implemented in a computer program product tangibly embodied in an information carrier (e.g., in a machine-readable storage device, for execution by a programmable processor), and method steps can be performed by a programmable processor executing a program of instructions to perform functions of the described implementations by operating on input data and generating output. The described features can be implemented advantageously in one or more computer programs that are executable on a programmable system including at least one programmable processor coupled to receive data and instructions from, and to transmit data and instructions to, a data storage system, at least one input device, and at least one output device. A computer program is a set of instructions that can be used, directly or indirectly, in a computer to perform a certain activity or bring about a certain result. A computer program can be written in any form of programming language, including compiled or interpreted languages, and it can be deployed in any form, including as a stand-alone program or as a module, component, subroutine, or other unit suitable for use in a computing environment.

Suitable processors for the execution of a program of instructions include, by way of example, both general and special purpose microprocessors, and the sole processor or one of multiple processors of any kind of computer. Generally, a processor will receive instructions and data from a read-only memory or a random-access memory or both. Elements of a computer can include a processor for executing instructions and one or more memories for storing instructions and data. Generally, a computer can also include, or be operatively coupled to communicate with, one or more mass storage devices for storing data files; such devices include magnetic disks, such as internal hard disks and removable disks; magneto-optical disks; and optical disks. Storage devices suitable for tangibly embodying computer program instructions and data include all forms of non-volatile memory, including by way of example semiconductor memory devices, such as EPROM, EEPROM, and flash memory devices; magnetic disks such as internal hard disks and removable disks; magneto-optical disks; and CD-ROM and DVD-ROM disks. The processor and the memory can be supplemented by, or incorporated in, ASICs (application-specific integrated circuits).

To provide for interaction with a user, the features can be implemented on a computer having a display device such as a CRT (cathode ray tube) or LCD (liquid crystal display) monitor for displaying information to the user and a keyboard and a pointing device such as a mouse or a trackball by which the user can provide input to the computer.

The features can be implemented in a computer system that includes a back-end component, such as a data server, or that includes a middleware component, such as an application server or an Internet server, or that includes a front-end component, such as a client computer having a graphical user interface or an Internet browser, or any combination of them. The components of the system can be connected by any form or medium of digital data communication such as a communication network. Examples of communication networks include, for example, a LAN, a WAN, and the computers and networks forming the Internet.

The computer system can include clients and servers. A client and server are generally remote from each other and typically interact through a network, such as the described one. The relationship of client and server arises by virtue of computer programs running on the respective computers and having a client-server relationship to each other.

In addition, the logic flows depicted in the figures do not require the particular order shown, or sequential order, to achieve desirable results. In addition, other steps may be provided, or steps may be eliminated, from the described flows, and other components may be added to, or removed from, the described systems. Accordingly, other implementations are within the scope of the following claims.

A number of implementations of the present disclosure have been described. Nevertheless, it will be understood that various modifications may be made without departing from the spirit and scope of the present disclosure. Accordingly, other implementations are within the scope of the following claims.

What is claimed is:

1. A computer-implemented method for detecting anomalous operation of devices, the method being executed by one or more processors and comprising:
   receiving, by an anomalous operation detection service, current signal data representing a driving current applied to a device over a time period;
   processing, by an anomalous operation detection service, the current signal data through a deep neural network (DNN) module, a frequency spectrum analysis (FSA) module, and a time series classifier (TSC) module to provide a set of indications, each indication in the set of indications indicating one of normal operation of the device and anomalous operation of the device;
   processing, by an anomalous operation detection service, the set of indications through a voting gate to provide an output indication, the output indication indicating one of normal operation of the device and anomalous operation of the device; and
   selectively transmitting one or more of an alert and a message based on the output indication.

2. The method of claim 1, wherein processing the current signal data through a DNN module comprises:
   receiving, by the DNN module, the current signal data;
   normalizing, by the DNN module, the current signal data to provide normalized data;
   inputting, by the DNN module, the normalized data to a DNN, the DNN providing a prediction; and
   providing an indication of the set of indications based on the prediction.

3. The method of claim 2, wherein the DNN is specific to the device.

4. The method of claim 1, wherein processing the current signal data through a FSA module comprises:
   receiving, by the FSA module, the current signal data;
   processing, by the FSA module, through each of a Hanning window sub-module, a Hamming window sub-module, and a Blackman sub-module, each processing the current signal data through a respective window function to provide an adjusted input, and processing the adjusted input through a fast Fourier transform (FFT) to provide a converted input; and
   outputting, by the FSA module, a sub-set of indications based on converted outputs of the Hanning window sub-module, the Hamming window sub-module, and the Blackman sub-module.

5. The method of claim 4, wherein the sub-set of indications comprises an indication based on converted outputs of the Hanning window sub-module and the Hamming window sub-module, and an indication based on the converted output of the Blackman window sub-module.

6. The method of claim 1, wherein processing the current signal data through a TSC module comprises:
   receiving, by the TSC module, the current signal data;
   processing, by the TSC module, the current signal data using dynamic time warping (DTW) to provide a comparison between the current signal to a groundtruth current signal; and
   providing an indication of the set of indications based on the comparison.

7. The method of claim 1, wherein the device is an Internet-of-Things (IoT) device and the anomalous operation detection service is executed as an edge service remote from a cloud platform.

8. A non-transitory computer-readable storage medium coupled to one or more processors and having instructions stored thereon which, when executed by the one or more processors, cause the one or more processors to perform operations for detecting anomalous operation of devices, the operations comprising:
   receiving, by an anomalous operation detection service, current signal data representing a driving current applied to a device over a time period;
   processing, by an anomalous operation detection service, the current signal data through a deep neural network (DNN) module, a frequency spectrum analysis (FSA) module, and a time series classifier (TSC) module to provide a set of indications, each indication in the set of indications indicating one of normal operation of the device and anomalous operation of the device;
   processing, by an anomalous operation detection service, the set of indications through a voting gate to provide an output indication, the output indication indicating one of normal operation of the device and anomalous operation of the device; and
   selectively transmitting one or more of an alert and a message based on the output indication.

9. The non-transitory computer-readable storage medium of claim 8, wherein processing the current signal data through a DNN module comprises:
   receiving, by the DNN module, the current signal data;
   normalizing, by the DNN module, the current signal data to provide normalized data;
   inputting, by the DNN module, the normalized data to a DNN, the DNN providing a prediction; and
   providing an indication of the set of indications based on the prediction.

10. The non-transitory computer-readable storage medium of claim 9, wherein the DNN is specific to the device.

11. The non-transitory computer-readable storage medium of claim 8, wherein processing the current signal data through a FSA module comprises:
   receiving, by the FSA module, the current signal data;
   processing, by the FSA module, through each of a Hanning window sub-module, a Hamming window sub-module, and a Blackman sub-module, each processing the current signal data through a respective window function to provide an adjusted input, and processing the adjusted input through a fast Fourier transform (FFT) to provide a converted input; and outputting, by the FSA module, a sub-set of indications based on converted outputs of the Hanning window sub-module, the Hamming window sub-module, and the Blackman sub-module.

12. The non-transitory computer-readable storage medium of claim 11, wherein the sub-set of indications comprises an indication based on converted outputs of the Hanning window sub-module and the Hamming window sub-module, and an indication based on the converted output of the Blackman window sub-module.

13. The non-transitory computer-readable storage medium of claim 8, wherein processing the current signal data through a TSC module comprises:

receiving, by the TSC module, the current signal data;

processing, by the TSC module, the current signal data using dynamic time warping (DTW) to provide a comparison between the current signal to a groundtruth current signal; and providing an indication of the set of indications based on the comparison.

14. The non-transitory computer-readable storage medium of claim 8, wherein the device is an Internet-of-Things (IoT) device and the anomalous operation detection service is executed as an edge service remote from a cloud platform.

15. A system, comprising:

a computing device; and a computer-readable storage device coupled to the computing device and having instructions stored thereon which, when executed by the computing device, cause the computing device to perform operations for detecting anomalous operation of devices, the operations comprising:

receiving, by an anomalous operation detection service, current signal data representing a driving current applied to a device over a time period;

processing, by an anomalous operation detection service, the current signal data through a deep neural network (DNN) module, a frequency spectrum analysis (FSA) module, and a time series classifier (TSC) module to provide a set of indications, each indication in the set of indications indicating one of normal operation of the device and anomalous operation of the device;

processing, by an anomalous operation detection service, the set of indications through a voting gate to provide an output indication, the output indication indicating one of normal operation of the device and anomalous operation of the device; and selectively transmitting one or more of an alert and a message based on the output indication.

16. The system of claim 15, wherein processing the current signal data through a DNN module comprises:

receiving, by the DNN module, the current signal data;

normalizing, by the DNN module, the current signal data to provide normalized data;

inputting, by the DNN module, the normalized data to a DNN, the DNN providing a prediction; and providing an indication of the set of indications based on the prediction.

17. The system of claim 16, wherein the DNN is specific to the device.

18. The system of claim 15, wherein processing the current signal data through a FSA module comprises:

receiving, by the FSA module, the current signal data;

processing, by the FSA module, through each of a Hanning window sub-module, a Hamming window sub-module, and a Blackman sub-module, each processing the current signal data through a respective window function to provide an adjusted input, and processing the adjusted input through a fast Fourier transform (FFT) to provide a converted input; and outputting, by the FSA module, a sub-set of indications based on converted outputs of the Hanning window sub-module, the Hamming window sub-module, and the Blackman sub-module.

19. The system of claim 18, wherein the sub-set of indications comprises an indication based on converted outputs of the Hanning window sub-module and the Hamming window sub-module, and an indication based on the converted output of the Blackman window sub-module.

20. The system of claim 15, wherein processing the current signal data through a TSC module comprises:

receiving, by the TSC module, the current signal data;

processing, by the TSC module, the current signal data using dynamic time warping (DTW) to provide a comparison between the current signal to a groundtruth current signal; and providing an indication of the set of indications based on the comparison.

* * * * *